(12) United States Patent
Kim et al.

(10) Patent No.: US 8,476,670 B2
(45) Date of Patent: Jul. 2, 2013

(54) LIGHT EMITTING DEVICES AND METHODS OF MANUFACTURING THE SAME

(75) Inventors: Jun-youn Kim, Hwaseong-si (KR); Bok-ki Min, Suwon-si (KR); Hyun-gi Hong, Suwon-si (KR); Jae-won Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 12/659,151

(22) Filed: Feb. 26, 2010

(65) Prior Publication Data

US 2011/0049549 A1 Mar. 3, 2011

(30) Foreign Application Priority Data

Aug. 26, 2009 (KR) .................. 10-2009-0079189

(51) Int. Cl.
*H01L 33/00* (2010.01)
(52) U.S. Cl.
USPC ............... 257/103; 257/98; 257/E33.069
(58) Field of Classification Search
USPC ................... 257/98, 103, E33.069
See application file for complete search history.

(56) References Cited

U.S. PATENT DOCUMENTS

| 6,563,141 B1 * | 5/2003 | Dawson et al. ........... 257/98 |
| 7,279,718 B2 | 10/2007 | Krames | |
| 7,915,147 B2 * | 3/2011 | Choi et al. ............ 438/478 |
| 2006/0091408 A1 | 5/2006 | Kim et al. | |
| 2008/0135864 A1 | 6/2008 | David | |
| 2008/0210956 A1 * | 9/2008 | Kim .................. 257/88 |
| 2009/0079035 A1 | 3/2009 | Wang | |
| 2009/0114935 A1 | 5/2009 | Huang | |

FOREIGN PATENT DOCUMENTS

| JP | 11-163402 | 6/1999 |
| JP | 2007-049063 | 2/2007 |
| JP | 2007-117236 A | 5/2007 |
| KR | 1020060038059 A | 5/2006 |
| KR | 10-0836455 | 6/2008 |

OTHER PUBLICATIONS

Dadgar, et al., "Crack-Free InGaN/GaN Light Emitters on Si(111)," *Phys. Stat. Sol. (a)*, vol. 188, No. 1, pp. 155-158 (2001).
Krost, et al., "GaN-based optoelectronics on silicon substrates," *Materials Science and Engineering*, vol. B93, pp. 77-84 (2002).

* cited by examiner

*Primary Examiner* — Tran Tran
(74) *Attorney, Agent, or Firm* — Harness, Dickey & Pierce, P.L.C.

(57) ABSTRACT

Light emitting devices and methods of manufacturing the light emitting devices. The light emitting devices include a silicon substrate; a metal buffer layer on the silicon substrate, a patterned dispersion Bragg reflection (DBR) layer on the metal buffer layer; and a nitride-based thin film layer on the patterned DBR layer and regions between patterns of the DBR layer.

9 Claims, 13 Drawing Sheets

FIG. 14D

# LIGHT EMITTING DEVICES AND METHODS OF MANUFACTURING THE SAME

CROSS-REFERENCE TO RELATED APPLICATIONS

This application claims priority to Korean Patent Application No. 10-2009-0079189, filed on Aug. 26, 2009, in the Korean Intellectual Property Office (KIPO), the entire contents of which is incorporated herein by reference.

BACKGROUND

1. Field

Example embodiments relate to light emitting devices and methods of manufacturing the light emitting devices, and more particularly, to light emitting devices based on gallium nitride (GaN) on a silicon substrate and methods of manufacturing the light emitting devices.

2. Description of the Related Art

Nitride-based semiconductors such as gallium nitride (GaN) have been applied to light emitting devices (eg., blue-purple light emitting diodes (LEDs) or laser diodes) and to electronic devices that are high-speed switching devices and/or high output devices. GaN-based LEDs are mainly manufactured on 2-inch sapphire substrates with 4-inch sapphire substrates gradually seeing increased use.

In order to increase productivity (e.g., yield) of LEDs and reduce fabrication costs, substrates should be enlarged. However, a sapphire substrate is expensive. Additionally, it is difficult to maintain uniform semiconductor layers because the sapphire substrate may bend at a high temperature due to a low thermal conductivity of the sapphire substrate when large sized semiconductor layers are grown.

Recently, there is increased interest in using silicon substrates for GaN-based light emitting devices. A silicon substrate is cheaper than a sapphire substrate or a silicon carbide (SiC) substrate. A large silicon substrate (e.g., 12 inch diameter) may be used, reducing fabrication costs and increasing productivity of the light emitting devices. In addition, because the silicon substrate is conductive, electrodes may be formed on a lower surface of the silicon substrate. Thus, fabrication processes of the light emitting devices may be simplified. In addition, since the silicon substrate has a higher thermal conductivity than that of the sapphire substrate, the silicon substrate may bend less than the sapphire substrate under a high thin film growth temperature used in the formation of a GaN thin film. Thus, the GaN thin film has a relatively greater uniformity using a silicon substrate of about 8 inches in diameter.

Regardless of the above advantages, it is difficult to use a silicon substrate as a substrate for GaN-based light emitting devices because a high dislocation density and cracks may occur due to a difference in lattice constants and thermal expansion coefficients between the silicon substrate and the GaN thin film. In addition, the silicon substrate may absorb light emitted from a light emitting layer and an external quantum efficiency of an LED may be reduced.

SUMMARY

Example embodiments include GaN-based light emitting devices using a silicon substrate, and methods of manufacturing the GaN-based light emitting devices.

According to example embodiments, a light emitting device includes a silicon substrate, a metal buffer layer formed on the silicon substrate, a patterned dispersion Bragg reflection (DBR) layer formed on the metal buffer layer, a nitride-based thin film layer formed on the patterned DBR layer and regions between patterns of the DBR layer and a light emitting layer comprising $Al_xGa_{1-x}In_yN$ ($0 \leq x < 1$, $0 \leq y < 1$).

The patterned DBR layer may be formed by alternately stacking layers including a layer including a material that is at least one of SiC, AlN, GaN, BN, BP, AlInGaN, and AlBGaN and a $SiO_2$ layer. The nitride-based thin film layer may include $Al_xGa_{1-x}In_yN$ ($0 \leq x \leq 1$, $0 \leq y \leq 1$). The metal buffer layer may be formed to have a single-layered structure or a multi-layered structure comprising an XY material, where X is at least one of Ti, Cr, Zr, Hf, Nb, and Ta, and Y is at least one of N, B, and $B_2$.

The patterned DBR layer may be patterned to form a plurality of holes, and the metal buffer layer may be patterned the same as a pattern of the patterned DBR layer. An XY material layer may be formed on the patterned DBR layer, where X is at least one of Ti, Cr, Zr, Hf, Nb, and Ta, and Y is at least one of N, B, and $B_2$. The plurality of holes may have a size in the nanometer order and the XY material layer is formed in the holes, where X is at least one of Ti, Cr, Zr, Hf, Nb, and Ta, and Y is at least one of N, B, and $B_2$. The metal buffer layer may have a thickness of about 1 nm to about 1 μm.

According to example embodiments, a light emitting device includes a silicon substrate, a metal buffer layer on the silicon substrate, a patterned dispersion Bragg reflection (DBR) layer on the metal buffer layer, a nitride-based thin film layer on the patterned DBR layer and regions between patterns of the DBR layer, and a light emitting layer.

According to example embodiments, a method of manufacturing a light emitting device includes forming a reflection buffer layer structure including a metal buffer layer and a DBR layer on a silicon substrate, and forming a GaN-based light emitting layer structure.

The forming of the reflection buffer layer structure may include forming the metal buffer layer on the silicon substrate, forming the DBR layer on the metal buffer layer, and patterning the DBR layer to form a plurality of holes in the DBR layer. The DBR layer may be formed by alternately stacking layers including a layer including a material that is at least one of SiC, AlN, GaN, BN, BP, AlInGaN, and AlBGaN and a $SiO_2$ layer. The DBR layer may be formed by alternately stacking layers comprising a SiC layer and a $SiO_2$ layer. The metal buffer layer may be formed to have a single-layered structure or a multi-layered structure including an XY material, where X is at least one of Ti, Cr, Zr, Hf, Nb, and Ta, and Y is at least one of N, B, and $B_2$.

In the patterning of the DBR layer, the metal buffer layer may be patterned together with the DBR layer. The method may further include forming an XY material layer on the DBR layer, where X is at least one of Ti, Cr, Zr, Hf, Nb, and Ta, and Y is at least one of N, B, and $B_2$. The forming the light emitting layer structure may include vertically growing the GaN-based semiconductor material in the plurality of holes and on the XY material layer. The plurality of holes may be formed to a size in the nanometer order.

The forming of the light emitting layer structure may include forming a GaN-based semiconductor material in the plurality of holes as nanorods and growing the GaN-based semiconductor material using an epitaxial lateral overgrowth (ELOG) process. The forming of the light emitting layer structure may include forming an XY material layer in the plurality of holes, where X is at least one of Ti, Cr, Zr, Hf, Nb, and Ta, and Y is at least one of N, B, and $B_2$, and growing a GaN-based semiconductor material from the XY material layer using an epitaxial lateral overgrowth (ELOG) process.

BRIEF DESCRIPTION OF THE DRAWINGS

Example embodiments will be more clearly understood from the following brief description taken in conjunction with the accompanying drawings. FIGS. 1-14D represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
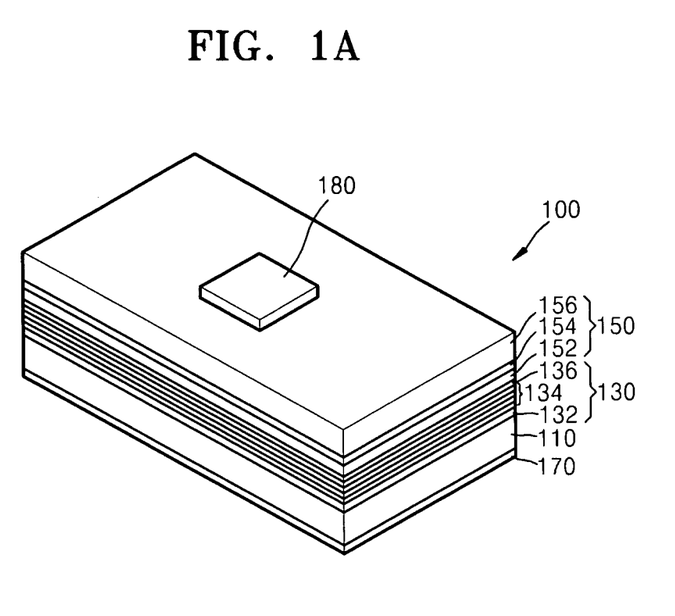
FIG. 1A is a perspective diagram of a light emitting device according to example embodiments.
Figure 1B:
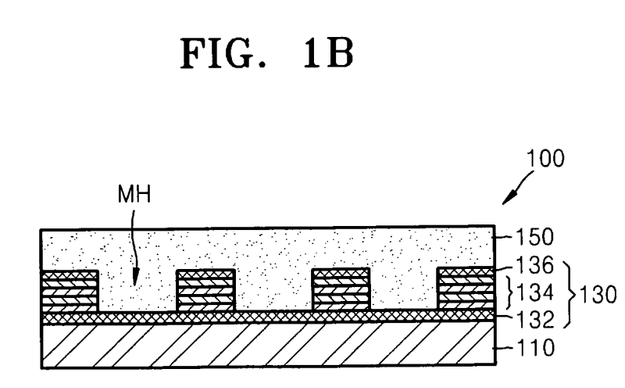
FIG. 1B is a cross-sectional diagram of a part of a light emitting device (e.g., the light emitting device illustrated in FIG. 1A)

FIG. 1A is a perspective diagram of a light emitting device according to example embodiments. FIG. 1B is a cross-sectional diagram of a part of a light emitting device (e.g., the light emitting device illustrated in FIG. 1A). Referring to FIGS. 1A and 1B, the light emitting device 100 may include a silicon substrate 110, a reflection buffer layer structure 130 on the silicon substrate 110, and a light emitting layer structure 150 based on gallium nitride (GaN) on the reflection buffer layer structure 130.

The reflection buffer layer structure 130 may reduce cracks that may occur when a GaN semiconductor material layer of the light emitting layer structure 150 is on the silicon substrate 110. The reflection buffer layer 130 may reduce and/or prevent light emitted from the light emitting layer structure 150 from being absorbed by the silicon substrate 110. The reflection buffer layer structure 130 may include a metal buffer layer 132 and a dispersion Bragg reflective (DBR) layer 134.

The DBR layer 134 may use reflection of light due to a periodic arrangement of refractive indices. The DBR layer 134 may be, for example, $SiO_2$ and $TiO_2$ layers which are alternately stacked. According to example embodiments, the DBR layer 134 may be a material which is rarely degenerated under a thermal treatment performed within a temperature range of about 1000° C. to about 1200° C. in consideration of the high temperature processes for growing GaN thin films. The DBR layer 134 may include a semiconductor material having an energy band gap which is greater than about 2.5 eV. The energy band gap range of the semiconductor material included in the DBR layer 134 may be adjusted according to the wavelength band of the light emitted from the light emitting layer 154. For example, the DBR layer 134 may be adjusted according to the energy band gap in a case where blue light (e.g., blue wavelength band) is emitted from a light emitting layer 154.

The DBR layer 134 may be alternately stacked layers. The alternately stacked layers may include a material layer (e.g., one of SiC, AlN, GaN, BN, BP, AlInGaN, and/or AlBGaN) and a $SiO_2$ layer. For example, layers including a SiC layer and a $SiO_2$ layer may be alternately stacked in the DBR layer 134. The number of layers in the DBR layer 134 may be appropriately selected in consideration of reflectance. The DBR layer 134 may include a plurality of holes (e.g., gaps) MH because it may be difficult to grow GaN thin films on the DBR layer 134. The growth difficulty may occur because a DBR layer 134 may not be conductive and may be in an amorphous state. The plurality of holes MH may be a few to a few tens of μm (e.g., a diameter of about 1 μm to about 10 μm). As the diameter of the holes MH is reduced a thickness of the GaN semiconductor material in which cracks do not occur may be increased.

The metal buffer layer 132 may support the reflection of the DBR layer 134 and may be a buffer material for growing GaN thin films. The reflective characteristic of the DBR layer 134 may be dependent upon an incident angle of light. When the metal buffer layer 132 is present, the dependency of the reflective characteristic on the incident angle may be reduced. The metal buffer layer 132 may be formed of a material having a thermal expansion coefficient and a lattice constant which are similar to those of the silicon substrate 110. The metal buffer layer 132 may have a single-layered structure or a multi-layered structure including XY material. X may be, for example, one of Ti, Cr, Zr, Hf, Nb, and/or Ta. Y may be, for example, one of N, B, and/or $B_2$. The metal buffer layer 132 may have a thickness of, for example, about 1 nm to about 1 μm.

An XY material layer 136 may be on the patterned DBR layer 134. X may be, for example, one of Ti, Cr, Zr, Hf, Nb, and/or Ta. Y may be, for example, one of N, B, and/or $B_2$. When the XY material layer 136 includes a material having a lattice constant less than that of GaN, a compressive strain may be applied to a GaN thin film on the XY material layer 136. The XY material layer may compensate for a tensile strain in the GaN thin film (e.g., tensile strain in a GaN thin film caused by high temperature growth followed by cooling). The material forming the XY material layer 136 may be the same as the XY material forming the metal buffer layer 132 or may be different from the XY material of the metal buffer layer 132.

A GaN-based semiconductor material may be vertically grown in the plurality of holes MH and on the XY material layer 136. The light emitting layer structure 150 may include a nitride-based thin film on the DBR layer 134. The nitride based thin film may be between the patterns of the DBR layer 134 and the light emitting layer 154. The nitride-based thin film may include, for example, $Al_xGa_{1-x}In_yN$ ($0 \leq x \leq 1$, $0 \leq y \leq 1$) and the light emitting layer 154 may include, for example, $Al_xGa_{1-x}In_yN$ ($0 \leq x < 1$, $0 \leq y < 1$). The light emitting layer structure 150 may include an n-GaN layer 152, a light emitting layer 154, and a p-GaN layer 156. The light emitting layer 154 may be, for example, a III-V group nitride semiconductor based on GaN (e.g., InGaN/GaN, InGaN/InGaN, InGaN/AlGaN, and/or InGaN/InAlGaN) single quantum well structure or multi quantum well structure. The p-GaN layer 156 and the n-GaN layer 152 may be formed by, for example, doping p-type impurities and n-type impurities during the growth of the GaN semiconductor material (e.g., $Al_xGa_{1-x}In_yN$ ($0 \leq x \leq 1$, $0 \leq y \leq 1$)).

Electrode layers 170 and 180 may apply electric power to the light emitting layer 154 so that electrons and holes combine in the light emitting layer 154. The electrode layers 170 and 180 may be, for example, on a lower surface of the silicon substrate 110 and an upper surface of the p-GaN layer 156, respectively. Because the silicon substrate 110 may be conductive the electrode layer 170 may be formed on the lower surface of the silicon substrate 110. When a light emitting structure includes a sapphire substrate which is not conductive, a process of separating the sapphire substrate from the light emitting structure may be required.

FIGS. 1A and 1B illustrate a vertical structure in which the electrode layer 170 is on a lower surface of the silicon substrate 110. Example embodiments of the present invention are not limited thereto. For example, the electrode layers 170 and 180 may be formed in a lateral structure, and the electrode layer 170 may be on an upper surface of the silicon substrate 110. The upper surface of the silicon substrate 110 may be exposed by, for example, etching a part of side surfaces of the reflection buffer layer structure 130 and the light emitting layer structure 150.

Figure 2:
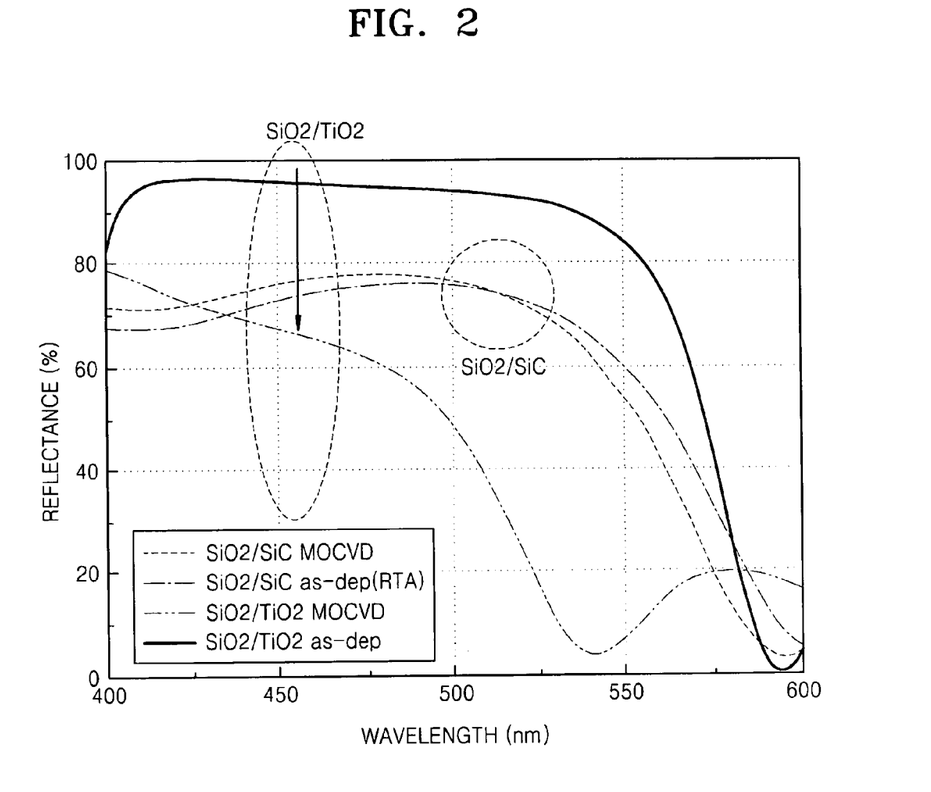
FIG. 2 is a graph of Reflectance (%) as a function of Wavelength (nm) for DBR layers before and after thermal treatment.

FIG. 2 is a graph of Reflectance (%) as a function of Wavelength (nm) for DBR layers before and after thermal treatment (e.g., SiO2/TiO2 and SiO2/SiC layers before and after thermal treatment). Changes in quality of $SiO_2$, $TiO_2$, and SiC thin films after a high temperature metal organic chemical vapor deposition (MOCVD) process may be observed. The graph of FIG. 2 may illustrate experimental results. $SiO_2$ and SiC thin films may exhibit little degeneration and a $TiO_2$ thin film may be deteriorated due to thermal treatment. Referring to FIG. 2, a case where the DBR layer includes $SiO_2/TiO_2$ layers and a case where the DBR layer includes $SiO_2/SiC$ layers may be compared. FIG. 2 may illustrate a thermal treatment performed for about twenty minutes under an $H_2$ atmosphere and about twenty minutes under an $NH_3$ atmosphere at a temperature of about 1100° C. in a MOCVD reactor. When the DBR layer includes the $SiO_2/TiO_2$ layers, the reflectance may be degraded after performing the thermal treatment. When the DBR layer includes the $SiO_2/SiC$ layers, the reflectance may have little change after thermal treatment.

Figure 3:
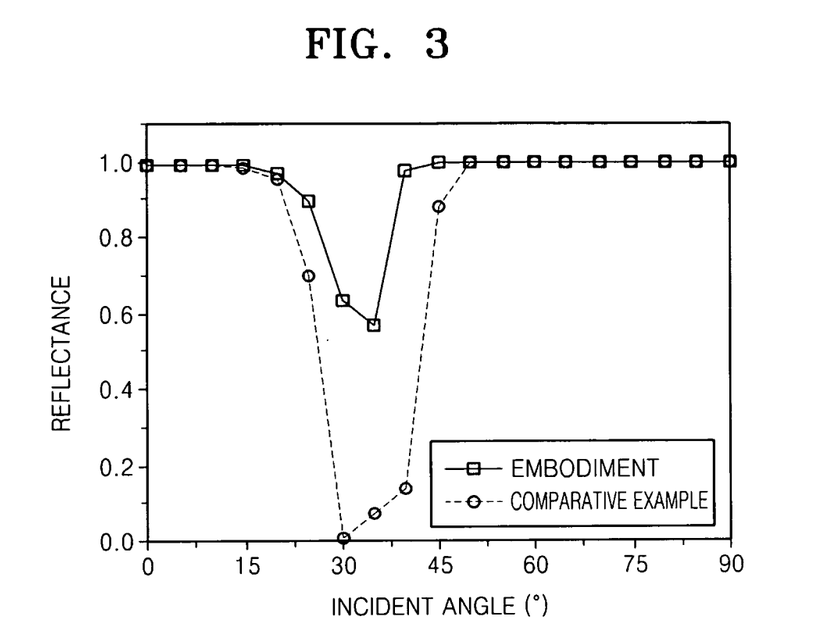
FIG. 3 is a graph of Reflectance as a function of Incident Angle (°) for a reflection buffer layer structure of a comparative example and an example embodiment.

FIG. 3 is a graph of Reflectance as a function of Incident Angle (°) for a reflection buffer layer structure of a comparative example and an example embodiment. The reflection buffer layer structure 130 may include the DBR layer 134 and the metal buffer layer 132. The comparative example may not include a metal buffer layer. Referring to FIG. 3, the reflectance characteristic of the comparative example may vary depending on the incident angle of light and the reflectance may be about 0 according to at least one incident angle of the light. This phenomenon may degrade light extracting efficiency in consideration that the light generated by the light emitting layer 154 is emitted in random directions. According to the example embodiment, the change in the reflectance characteristic caused by the incident angle of the light is greatly reduced relative to the comparative example.

When the reflection buffer layer structure 130 is included in a light emitting device (e.g., the light emitting device 100), the light emitted from the light emitting layer 154 may not be absorbed by the silicon substrate 110, may be reflected by the reflection buffer layer structure 130 and discharged out of the light emitting device 100. The external quantum efficiency of the light emitting device 100 may be improved. Thin films may be grown on the silicon substrate 110 with fewer cracks, and it may be easier to form electrode layers 170 and 180.

Figure 4:
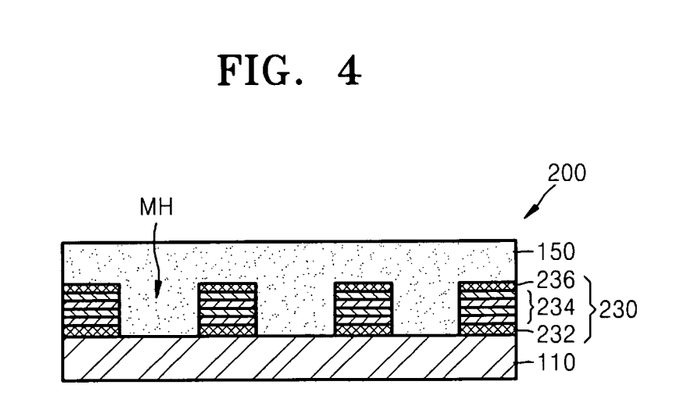
FIG. 4 is a cross-sectional diagram of a light emitting device according to example embodiments.

FIG. 4 is a cross-sectional diagram of a light emitting device 200 according to example embodiments. The light emitting device 200 may include a silicon substrate 110, a reflection buffer layer structure 230 and a light emitting layer structure 150. The reflection buffer layer structure 230 may include a metal buffer layer 232 and a DBR layer 234 including a plurality of holes MH. The metal buffer layer 232 may have a same pattern as the DBR layer 234. An XY material layer 236 may be on the DBR layer 234. The light emitting layer structure 150 may include an AlN layer on a lower surface of the plurality of holes MH (not shown). A GaN thin film may not be on the metal buffer layer 232 in the plurality of holes MH and the metal buffer layer 232 may not necessarily be a crystalline structure.

Figure 5:
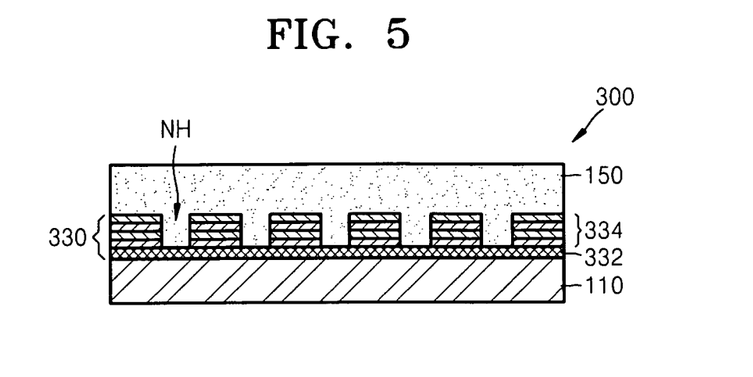
FIG. 5 is a cross-sectional diagram of a light emitting device according to example embodiments.

FIG. 5 is a cross-sectional diagram of a light emitting device 300 according to example embodiments. The light emitting device 300 may include a silicon substrate 110, a reflection buffer layer structure 330 and a light emitting layer structure 150. The reflection buffer layer structure 330 may include a metal buffer layer 332 and a DBR layer 334. The DBR layer 334 may have a plurality of holes NH having a size on the order of nanometers. Each of the holes NH may have a diameter of about 10 nm to about 1 μm (e.g., a diameter of about 100 nm). The light emitting layer structure 150 may include GaN thin films in the plurality of holes NH that are nanorods and an epitaxial layer (e.g., an epitaxial layer formed by an epitaxial lateral overgrowth (ELOG) process). The metal buffer layer 332 may not have the same pattern as the DRB layer 334.

Figure 6:
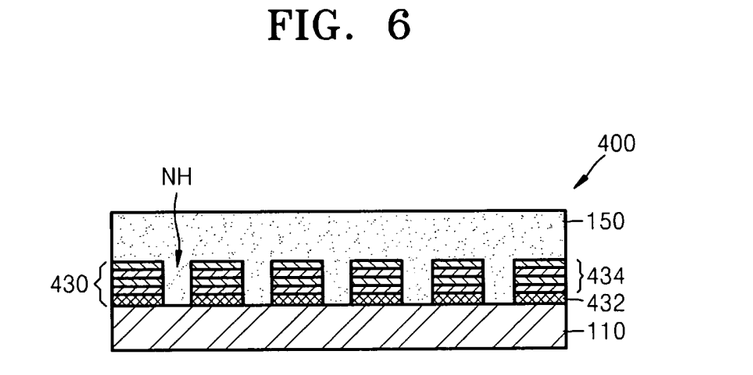
FIG. 6 is a cross-sectional diagram of a light emitting device according to example embodiments.

FIG. 6 is a cross-sectional diagram of a light emitting device 400 according to example embodiments. The light emitting device 400 may include a silicon substrate 110, a reflection buffer layer structure 430 and a light emitting layer structure 150. The reflection buffer layer structure 430 may include a metal buffer layer 432 and a DBR layer 434 including a plurality of holes NH. The metal buffer layer 432 may have the same pattern as the DBR layer 434. A GaN thin film may not be on a metal buffer layer 432 in the holes NH and the metal buffer layer 432 may not necessarily be a crystalline structure. When the GaN thin film is formed as nanorods, the GaN thin film may be less affected by a difference in the lattice constants and the thermal expansion coefficients between the GaN thin film and the silicon substrate 110.

Figure 7:
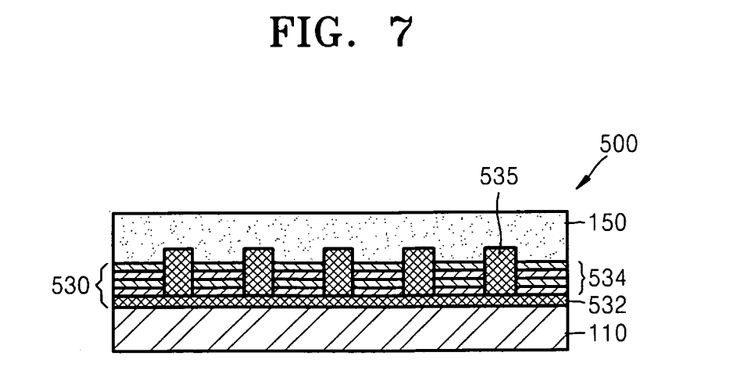
FIG. 7 is a cross-sectional diagram of a light emitting device according to example embodiments.

FIG. 7 is a cross-sectional diagram of a light emitting device 500 according to example embodiments. The light emitting device 500 may include a silicon substrate 110, a reflection buffer layer structure 530 and a light emitting layer structure 150. The reflection buffer layer structure 530 may include a metal buffer layer 532 and a DBR layer 534 that is patterned to have a plurality of holes in which an XY material layer 535 is formed. The metal buffer layer 532 may not have a same pattern as the DRB layer 534. The GaN thin film may be on the XY material layer 535 (e.g., formed on the XY material layer 535 by an ELOG process). A material forming the XY material layer 535 may be the same as an XY material forming the metal buffer layer 532 or may be different from the XY material of the metal buffer layer 532.

Figure 8:
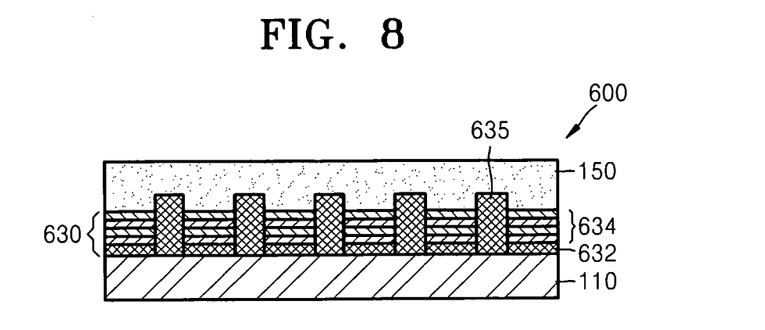
FIG. 8 is a cross-sectional diagram of a light emitting device according to example embodiments.

FIG. 8 is a cross-sectional diagram of a light emitting device 600 according to example embodiments. The light emitting device 600 may include a silicon substrate 110, a reflection buffer layer structure 630 and a light emitting layer structure 150. The reflection buffer layer structure 630 may include a metal buffer layer 632 and a DBR layer 634 that are patterned to have a plurality of holes. The metal buffer layer 632 may have the same pattern as the DBR layer 634. An XY material layer 635 may be in the plurality of holes, and the GaN thin film may be on the XY material layer 635 (e.g., may be formed on the XY material layer 635 by an ELOG process).

Light emitting devices according to example embodiments may include a reflection buffer layer structure including a metal buffer layer and a patterned DBR layer. Light absorbed by a silicon substrate 110 may be reduced and the light extracting efficiency of the light emitting device may be increased.

Figure 9A:
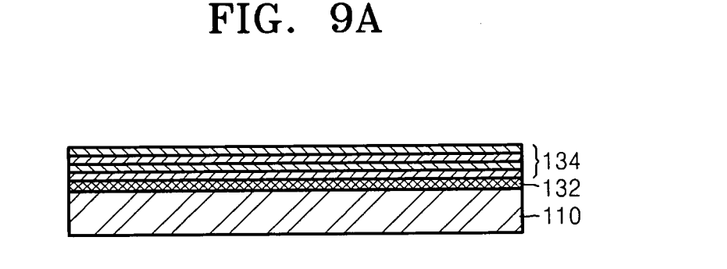
FIGS. 9A-9E are cross-sectional diagrams illustrating methods of manufacturing the light emitting device of FIG. 1B according to example embodiments.

FIGS. 9A-9E are cross-sectional diagrams illustrating methods of manufacturing the light emitting device 100 of FIG. 1B according to example embodiments. Referring to FIG. 9A, a metal buffer layer 132 and a DBR layer 134 may be sequentially formed on a silicon substrate 110. The metal buffer layer 132 may be formed of a material having a lattice constant and a thermal expansion coefficient similar to that of the silicon substrate 110. The metal buffer layer 132 may be formed to have a single-layered structure or multi-layered structure including an XY material. X may be, for example, one of Ti, Cr, Zr, Hf, Nb, and/or Ta. Y may be, for example, one of N, B, and/or $B_2$. The metal buffer layer 132 may have a thickness of, for example, about 1 nm to about 1 µm.

The DBR layer 134 may be formed of a material thermally resistant to a high temperature MOCVD process including growing of a GaN-based semiconductor material. The DBR layer 134 may be formed by alternately stacking layers. The alternately stacked layers may include a material layer (e.g., one of SiC, AlN, GaN, BN, BP, AlInGaN, and/or AlBGaN) and a $SiO_2$ layer. If the DBR layer 134 is formed of layers of $SiO_2$/SiC, the reflectance of the DBR layer 134 may have little change after thermal treatment relative to a DBR layer 134 formed of $SiO_2$/$TiO_2$ layers, as described above with reference to FIG. 2.

Figure 9B:
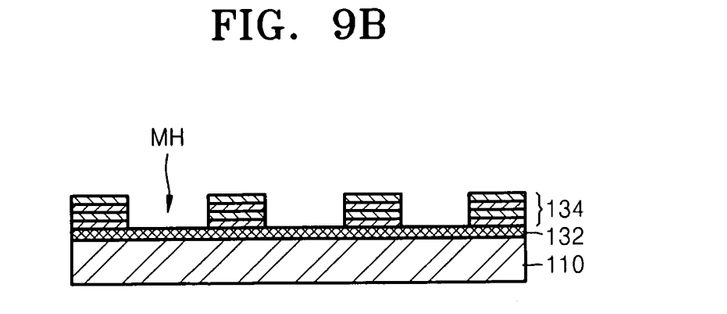
Figure 9C:
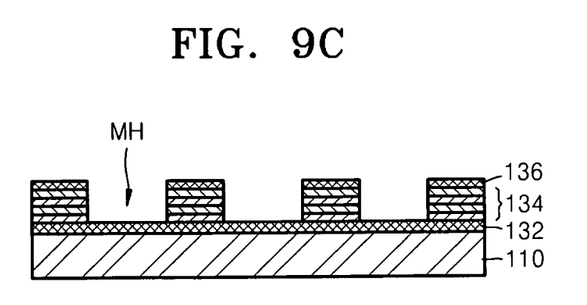
Figure 9D:
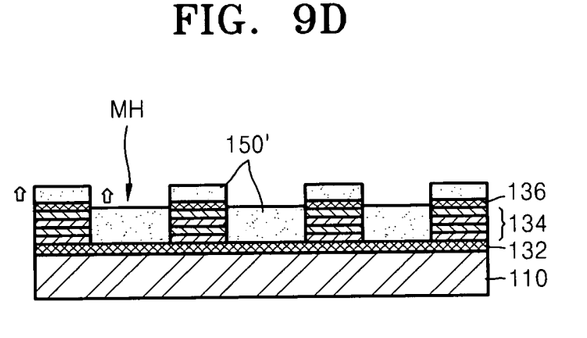
Figure 9E:
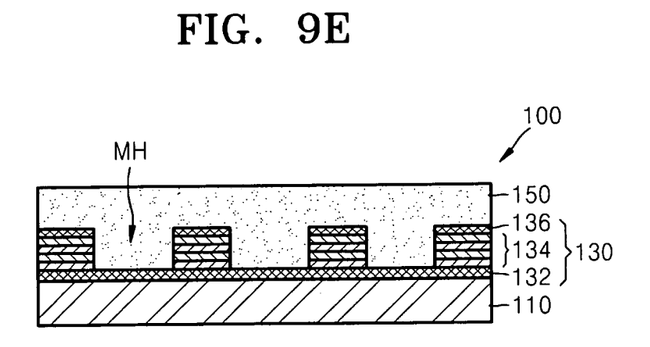

Referring to FIG. 9B, the DBR layer 134 may be patterned to form a plurality of holes MH. A diameter of a hole MH may be a few to a few tens of µm (e.g., about 1 µm to about 10 µm). Referring to FIG. 9C, the XY material layer 136 may be formed on the patterned DBR layer 134. The forming of the XY material layer 136 may be performed before or after the operation of FIG. 9B. For example, the XY material layer 136 may be deposited on the DBR layer 134, and the DBR layer 134 and the XY material layer 136 may be patterned together. Referring to FIG. 9D, a GaN-based semiconductor material 150' may be vertically grown on an upper surface of the XY material layer 136 and in the holes MH to manufacture the light emitting device 100 shown in FIG. 9E.

Figure 10A:
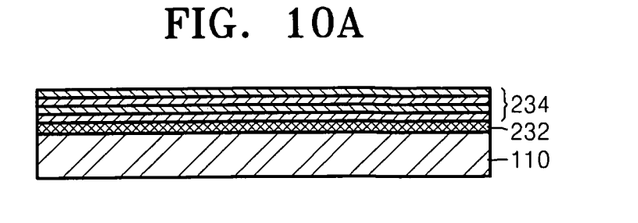
FIGS. 10A-10E are cross-sectional diagrams illustrating methods of manufacturing the light emitting device of FIG. 4 according to example embodiments.
Figure 10B:
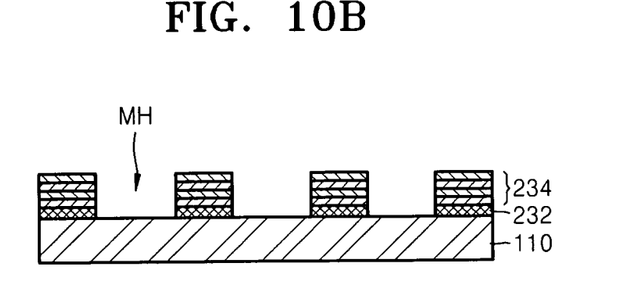
Figure 10C:
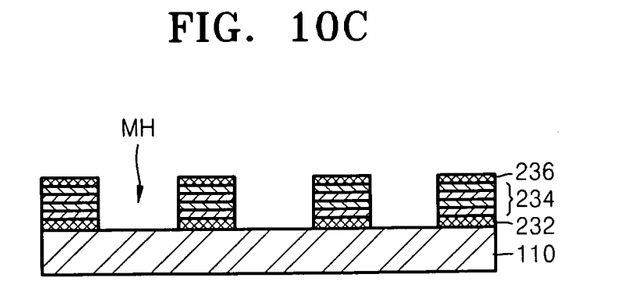
Figure 10D:
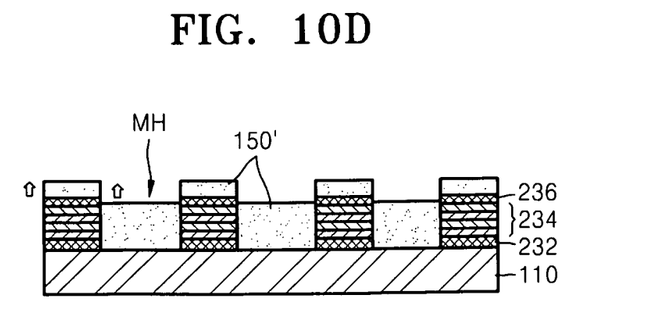
Figure 10E:
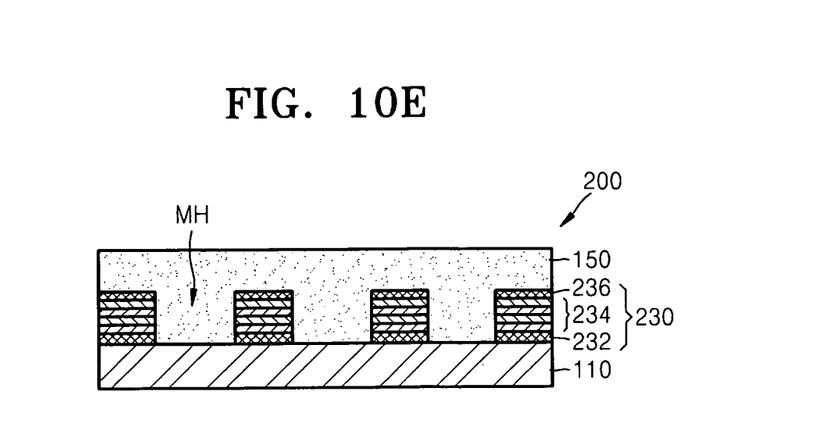

FIGS. 10A-10E are cross-sectional diagrams illustrating methods of manufacturing the light emitting device 200 of FIG. 4 according to example embodiments. Referring to FIG. 10A, a metal buffer layer 232 and a DBR layer 234 may be sequentially formed on a silicon substrate 110. Referring to FIG. 10B, the DBR layer 234 and the metal buffer layer 232 may be patterned together to form a plurality of holes MH. Each of the holes MH may have a diameter of, for example, about a few µm. Referring to FIG. 10C, an XY material layer 236 may be formed on the DBR layer 234. The forming of the XY material layer 236 may be performed before or after performing the operation of FIG. 10B. For example, the XY material layer 236 may be deposited on the DBR layer 234, and the DBR layer 234, the metal buffer layer 232 and the XY material layer 236 may be patterned together. Referring to FIG. 10D, a GaN-based semiconductor material 150' may be vertically grown on an upper surface of the XY material layer 236 and in the holes MH to manufacture the light emitting device 200 shown in FIG. 10E.

Figure 11A:
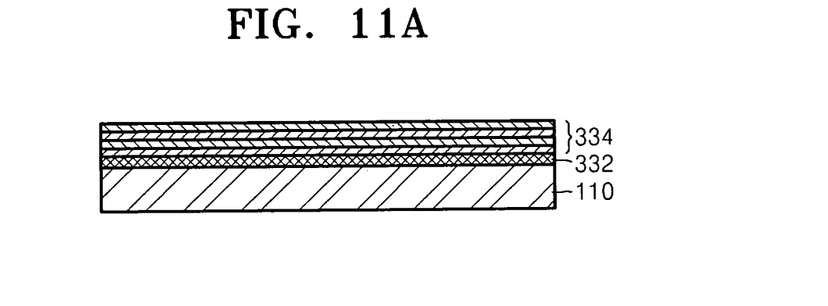
FIGS. 11A-11D are cross-sectional diagrams illustrating methods of manufacturing the light emitting device of FIG. 5 according to example embodiments.
Figure 11B:
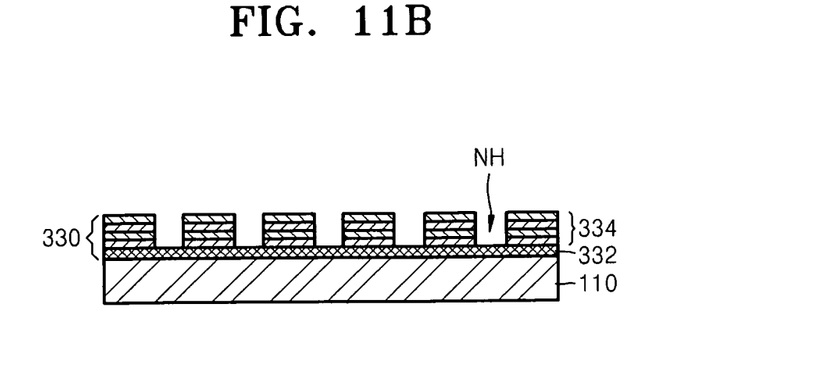
Figure 11C:
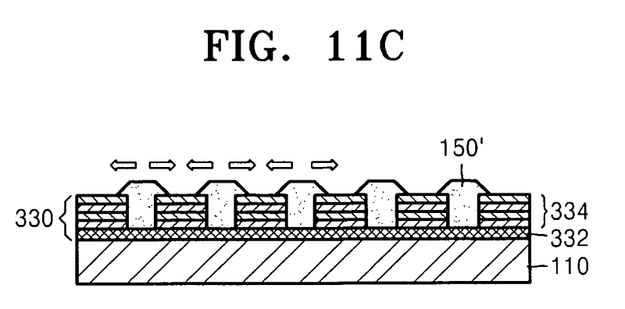
Figure 11D:
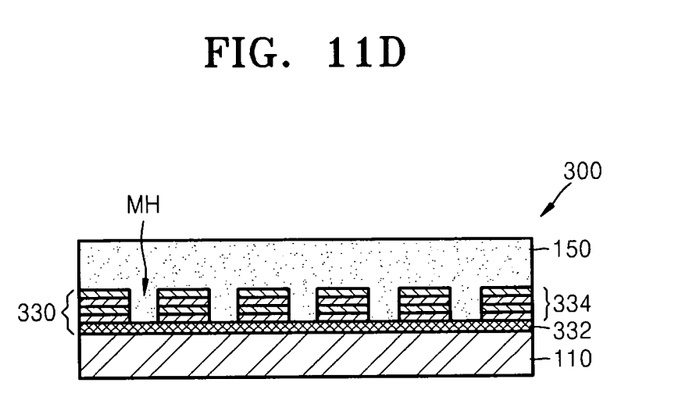

FIGS. 11A-11D are cross-sectional diagrams illustrating methods of manufacturing the light emitting device 300 of FIG. 5 according to example embodiments. Referring to FIG. 11A, a metal buffer layer 332 and a DBR layer 334 may be sequentially formed on a silicon substrate 110. Referring to FIG. 11B, the DBR layer 334 may be patterned to form a plurality of holes NH. Each of the holes NH may have a diameter on the order of nanometers (e.g., from about 10 nm to about 1 µm). The GaN-based semiconductor material 150' may be grown in the holes NH as nanorods and an ELOG process may be performed to manufacture the light emitting device 300 shown in FIG. 11D.

Figure 12A:
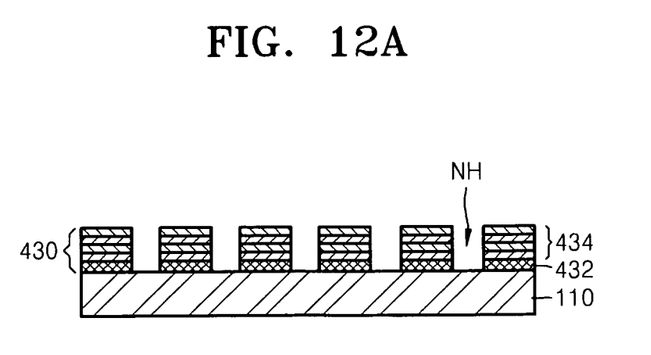
FIGS. 12A-12C are cross-sectional diagrams illustrating methods of manufacturing the light emitting device of FIG. 6 according to example embodiments.
Figure 12B:
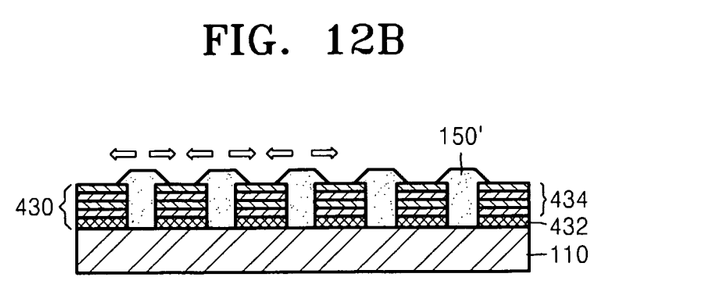
Figure 12C:
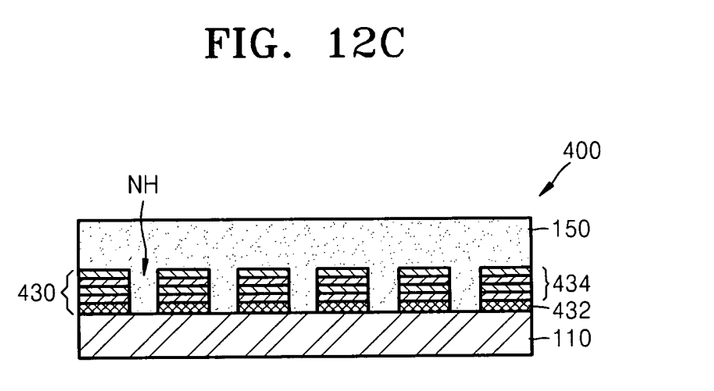

FIGS. 12A-12C are cross-sectional diagrams illustrating methods of manufacturing the light emitting device 400 of FIG. 6 according to example embodiments. Referring to FIG. 12A, a metal buffer layer 432 and a DBR layer 434 may be sequentially formed on the silicon substrate 110. The metal buffer layer 432 and the DBR layer 434 may be patterned to form a plurality of holes NH. Referring to FIG. 12B, the GaN-based semiconductor material 150' may be grown in the holes NH as nanorods, and an ELOG process may be performed to form the light emitting device 400 shown in FIG. 12C.

Figure 13A:
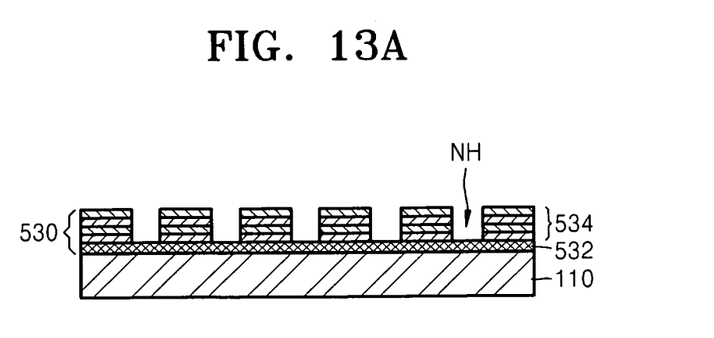
FIGS. 13A-13D are cross-sectional diagrams illustrating methods of manufacturing the light emitting device of FIG. 7 according to example embodiments.
Figure 13B:
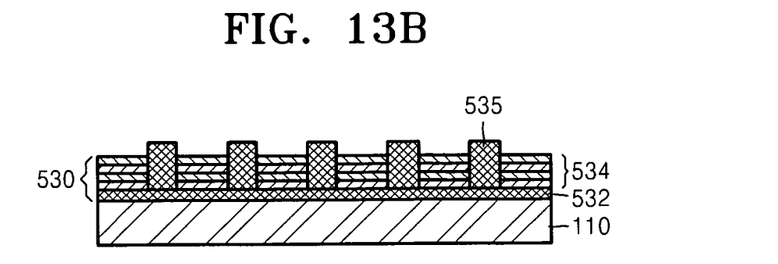
Figure 13C:
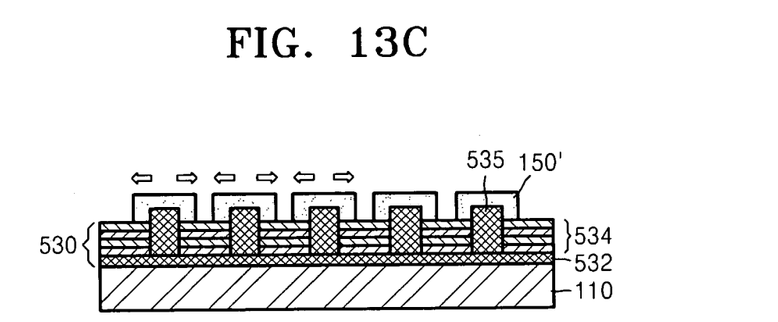
Figure 13D:
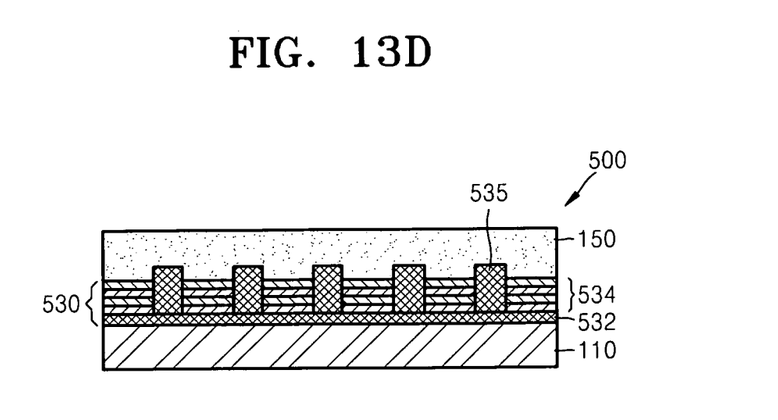

FIGS. 13A-13D are cross-sectional diagrams illustrating methods of manufacturing the light emitting device 500 of FIG. 7 according to example embodiments. Referring to FIG. 13A, a metal buffer layer 532 and a DBR layer 534 may be sequentially formed on a silicon substrate 110. The DBR layer 534 may be patterned to form a plurality of holes NH. Referring to FIG. 13B, an XY material layer 535 may be formed in the plurality of holes NH. The material forming the XY material layer 535 may or may not be the material forming the metal buffer layer 532. Referring to FIG. 13C, a GaN-based semiconductor material 150' may be grown on the XY material layer 535 using an ELOG process to form the light emitting device 500 of FIG. 13D.

Figure 14A:
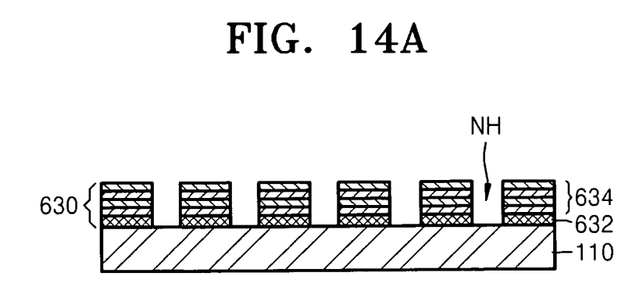
FIGS. 14A-14D are cross-sectional diagrams illustrating methods of manufacturing the light emitting device of FIG. 8 according to example embodiments.
Figure 14B:
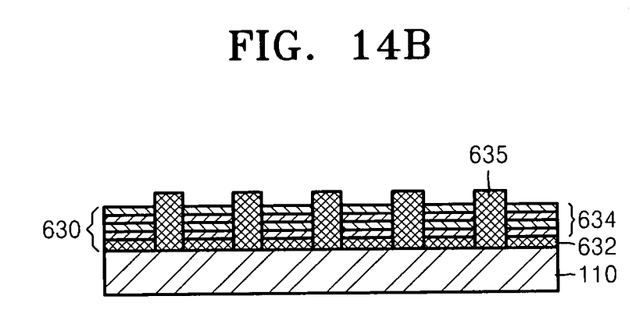
Figure 14C:
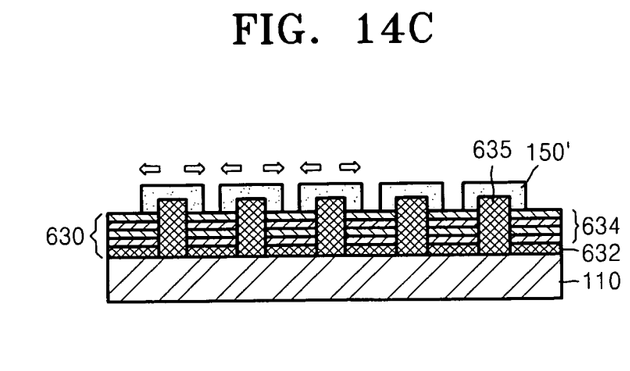
Figure 14D:
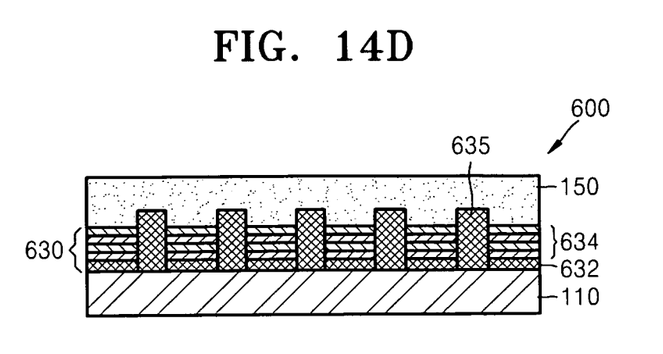

FIGS. 14A-14D are cross-sectional diagrams illustrating methods of manufacturing the light emitting device 600 of FIG. 8 according to example embodiments. Referring to FIG. 14A, a metal buffer layer 632 and a DBR layer 634 may be sequentially formed on a silicon substrate 110. The DBR layer 634 and the metal buffer layer 632 may be patterned to form a plurality of holes NH. Referring to FIG. 14B, the XY material layer 635 may be formed in the holes NH. Referring to FIG. 14C, a GaN-based semiconductor material 150' may be grown on the XY material layer 635 using an ELOG process to form the light emitting device 600 of FIG. 14D.

According to the above-described methods of manufacturing the light emitting device, a light emitting device having improved and/or excellent thin film quality and improved and/or high optical efficiency may be formed on a large-size wafer, and thus, productivity may be improved.

While example embodiments have been particularly shown and described, it will be understood by one of ordinary skill in the art that variations in form and detail may be made therein without departing from the spirit and scope of the claims.

What is claimed is:
1. A light emitting device comprising:
a silicon substrate;
a metal buffer layer on the silicon substrate, wherein the metal buffer layer includes at least one of B and $B_2$;
a patterned dispersion Bragg reflection (DBR) layer on the metal buffer layer, the patterned DBR layer including a plurality of holes, wherein each of the plurality of holes has a diameter of about 10 nm to about 1 µm;
a nitride-based thin film layer on the patterned DBR layer and regions between patterns of the DBR layer; and
a light emitting layer including $Al_xGa_{1-x}In_yN$ ($0 \leq x < 1$, $0 \leq y < 1$).

2. The light emitting device of claim 1, wherein the patterned DBR layer includes alternately stacked layers of a $SiO_2$ layer and a material layer, the material layer including at least one of SiC, AlN, GaN, BN, BP, AlInGaN, and AlBGaN.

3. The light emitting device of claim 1, wherein the nitride-based thin film layer includes $Al_xGa_{1-x}In_yN$ ($0 \leq x \leq 1$, $0 \leq y \leq 1$).

4. The light emitting device of claim 1, wherein the metal buffer layer is a multi-layered structure
the metal buffer layer includes an XY material,
X is at least one of Ti, Cr, Zr, Hf, Nb, and Ta, and
Y is at least one of B, and $B_2$.

5. The light emitting device of claim 1, wherein the metal buffer layer has about a same pattern as the DBR layer.

6. The light emitting device of claim 5, further comprising:
an XY material layer on the patterned DBR layer,
wherein X is at least one of Ti, Cr, Zr, Hf, Nb, and Ta, and
Y is at least one of N, B, and $B_2$.

7. The light emitting device of claim 5, further comprising:
an XY material layer in the holes,
wherein the plurality of holes have a size on the order of nanometers,
X is at least one of Ti, Cr, Zr, Hf, Nb, and Ta, and
Y is at least one of N, B, and $B_2$.

8. The light emitting device of claim 1, wherein a thickness of the metal buffer layer is about 1 nm to about 1 μm.

9. The light emitting device of claim 1, wherein the light emitting layer includes a plurality of nanorods.

* * * * *